United States Patent [19]
Shu et al.

[11] Patent Number: 5,861,826
[45] Date of Patent: Jan. 19, 1999

[54] METHOD AND APPARATUS FOR CALIBRATING INTEGRATED CIRCUIT ANALOG-TO-DIGITAL CONVERTERS

[75] Inventors: Tzi-Hsiung Shu, Melbourne; George E. Von Dolteren, Palm Bay, both of Fla.

[73] Assignee: Harris Corporation, Palm Bay, Fla.

[21] Appl. No.: 885,273

[22] Filed: Jun. 30, 1997

[51] Int. Cl.$^6$ ........................................................ H03M 1/10
[52] U.S. Cl. ............................................................. 341/120
[58] Field of Search ......................................... 341/118, 119, 341/120, 121

[56] References Cited

U.S. PATENT DOCUMENTS

| | | |
|---|---|---|
| 4,354,177 | 10/1982 | Sloane . |
| 4,903,024 | 2/1990 | Evans et al. . |
| 5,047,772 | 9/1991 | Ribner . |
| 5,057,839 | 10/1991 | Koch . |
| 5,140,325 | 8/1992 | Yu et al. . |
| 5,144,311 | 9/1992 | Buhler et al. . |
| 5,177,484 | 1/1993 | Bruckmann . |
| 5,196,851 | 3/1993 | Patel et al. ............................. 341/118 |
| 5,251,162 | 10/1993 | Gazsi . |
| 5,266,951 | 11/1993 | Knegler et al. . |
| 5,465,092 | 11/1995 | Mayes et al. ........................... 341/118 |
| 5,594,439 | 1/1997 | Swanson . |
| 5,594,612 | 1/1997 | Henrion . |
| 5,659,312 | 8/1997 | Sunter et al. ........................... 341/120 |

OTHER PUBLICATIONS

Yuh–Min, et al., "A 13–b 2.5–MHz Self–Calibrated Pipelined A/D Converter in 3–μm CMOS", *IEEE Journal of Solid–State Circuits*, vol. 26, No. 4, Apr. 1991.

Douglas A. Mercer, "A 14–b 2.5 MSPS Pipelined ADC with On–Chip EPROM", *IEEE Journal on Solid–State Circuits*, vol. 31, No. 1, Jan. 1996.

Stephen H. Lewis, et al., "A 10–b 20–Msample/s Analog–to–Digital Converter", *IEEE Journal on Solid–State Circuits*, vol. 27, No. 3, Mar. 1992.

Tzi–Hsiung Shu, "A BiCMOS Fully–Differential 10–Bit 40MHz Pipelined ADC", *IEEE Journal on Solid–State Circuits*, pp. 154–157.

*Primary Examiner*—Howard L. Williams
*Attorney, Agent, or Firm*—Allen, Dyer, Doppelt, Milbrath & Gilchrist, P.A.

[57] ABSTRACT

The calibration method preferably comprises the steps of: driving the analog-to-digital converter (ADC) with at least one test signal; calibrating the driven ADC over a series of successive ADC calibrations; generating a series of successive ADC figure of merit measurements for respective successive ADC calibrations, the series of successive ADC figure of merit measurements defining at least a portion of a curve having a local minimum/maximum; and stopping calibrating at an ADC calibration corresponding to the local minimum/maximum of the curve defined by the series of successive ADC figure of merit measurements. The step of calibrating preferably comprises incrementally calibrating the ADC over the series of successive ADC calibrations. The method preferably further comprises the step of determining the local minimum/maximum of the curve. In particular, the step of determining preferably comprises fitting an equation to the series of ADC figure of merit measurements; and calculating the local minimum/maximum based upon the equation. Of course, the step of fitting the equation preferably comprises fitting the equation based upon a predetermined number of prior ADC figure of merit measurements. The step of fitting the equation may comprise fitting a polynomial equation, such as a third order equation, to the series of ADC figure of merit measurements. In addition, the step of calculating the local minimum/maximum may preferably comprise calculating a first derivative of the equation.

42 Claims, 4 Drawing Sheets

METHOD AND APPARATUS FOR CALIBRATING INTEGRATED CIRCUIT ANALOG-TO-DIGITAL CONVERTERS

FIELD OF THE INVENTION

The present invention relates to the field of electronics, and, more particularly, to a calibration method and apparatus for analog-to-digital converter circuits.

BACKGROUND OF THE INVENTION

Analog-to-digital converters (ADCs) are widely used to process electrical signals in many electronic applications. An integrated circuit analog-to-digital converter typically accepts an analog input voltage signal and converts the signal into a digital form as the output. A modern digital communication system, such as for a cellular telephone base station, for example, may often require an ADC with a high resolution of greater than 12 bits, a bandwidth greater than 200 MHz, and low power consumption and low distortion for improved overall system performance.

A pipelined ADC includes a series of subconverter stages with each stage including a flash analog-to-digital converter, a digital-to-analog converter (DAC) and an interstage amplifier connecting the DAC to an adjacent stage. The last stage typically includes only a flash ADC. A multi-step ADC may include one or more similar subconverter stages which are sequentially reused in generating the digital output signal.

There are several potential error sources in the subconverter stages of an integrated circuit analog-to-digital converter. These errors include offset, noise, DAC and flash ADC errors, and errors in the interstage gain amplifier. The subconverter flash ADC error may be readily corrected, for example, by the use of digital error correction logic circuits. The kT/C thermal noise error source caused in a sampled-data system may be reduced by proper choice of the sampling capacitor size.

Two dominant error sources in a high resolution pipelined or multi-step ADC are the DAC and the interstage amplifier gain errors. To reduce these two errors, a conventional method has been to measure the components that contribute to the errors, and then calculate and implement the calibration. However, the effectiveness of the calibration is often judged by the linearity of the analog-to-digital converter. Although the correlation between the converter linearity and the error contributing components is theoretically close, it is still only an indirect method to achieve good linearity through component measurement/calibration.

U.S. Pat. No. 4,354,177 to Sloane discloses an apparatus and method for exciting the input of an ADC with exponential signals to generate histograms to determine an amplitude probability distribution of each digital output value. The histograms may be processed in a manner which produces the transfer characteristic of the converter under test which is independent of the dynamic characteristics of the excitation signals, thus eliminating the need for accurate knowledge of the parameter values of the testing circuit.

The DAC of an analog-to-digital converter typically includes a resistor ladder network formed by thin film resistors. These resistors may be laser trimmed to reduce the DAC error. However, the interstage gain error is not as readily determined and corrected. In the past, attempts have been made to trim the capacitors or disconnect small value trimming capacitors associated with a switched capacitor interstage amplifier as disclosed, for example, in an article entitled "A 13-b 2.5-MHz Self-Calibrated Pipelined A/D Converter in 3-$\mu$m CMOS" by Lin et al. appearing in IEEE Journal of Solid-State Circuits, vol. 26, No. 4, Apr. 1991. Unfortunately, trimming capacitors may be extremely difficult in practice, especially to achieve predictable and accurate results. Predictable results are also very difficult when disconnecting small trim capacitors to calibrate the gain.

Unfortunately, conventional test and calibration circuits, such as disclosed in U.S. Pat. No. 5,266,951 to Kuegler et al., for example, typically require a predetermined frequency or signal level and also require the calculation of calibration values corresponding to the input signal level and slope. Moreover, a large amount of calibration data has to be processed and stored. Similarly, U.S. Pat. No. 4,903,024 to Evans et al. also discloses a calibration method using a Fast Fourier Transform (FFT) to calculate calibration data with respect to the input level and slope. Both systems require a large number of data calculations and storage which therefore greatly slows the cycle time of the calibration. In addition, a highly linear input source is also often required.

SUMMARY OF THE INVENTION

In view of the foregoing background, it is therefore an object of the present invention to provide a method and apparatus for calibrating an integrated circuit analog-to-digital converter, and wherein the calibration uses a relatively small number of samples.

It is also an object of the present invention to provide a method and apparatus for calibrating an integrated circuit analog-to-digital converter, and wherein the requirements for the input signal(s) are relaxed.

These and other objects, advantages, and features in accordance with the present invention are provided by an ADC calibration method including the steps of: driving the ADC with at least one test signal; calibrating the driven ADC over a series of successive ADC calibrations; generating a series of successive ADC figure of merit measurements for respective successive ADC calibrations, the series of successive ADC figure of merit measurements defining at least a portion of a curve having a local minimum/maximum; and stopping calibrating at an ADC calibration corresponding to the local minimum/maximum of the curve defined by the series of successive ADC figure of merit measurements. The step of calibrating preferably comprises incrementally calibrating the ADC over the series of successive ADC calibrations. Accordingly, the calibration can be readily achieved without requiring an excessive number of calculations.

The method preferably further comprises the step of determining the local minimum/maximum of the curve. In particular, the step of determining preferably comprises fitting an equation to the series of ADC figure of merit measurements; and calculating the local minimum/maximum based upon the equation. Of course, the step of fitting the equation preferably comprises fitting the equation based upon a predetermined number of prior ADC figure of merit measurements. The step of fitting the equation may comprise fitting a polynomial equation, such as a third order equation, to the series of ADC figure of merit measurements. In addition, the step of calculating the local minimum/maximum may preferably comprise calculating a first derivative of the equation. Accordingly, the analysis of the figure of merit data is relatively straightforward and readily implemented.

The step of stopping the calibrating may comprise stopping the calibrating based upon reaching the predicted or calculated local minimum/maximum. Accordingly, over calibrating the ADC may be avoided and the amount of calculations thereby also reduced. The calibrating may be performed by at least one of laser trimming and digital calibrating the ADC.

The step of generating the series of respective ADC figure of merit measurements preferably comprises generating a series of figure of merit measurements which can tolerate non-ideal test input signals. For example, the ADC figure of merit measurements may be at least one of signal-to-noise ratio (SNR) measurements, signal-to-noise and distortion (SINAD) measurements, total harmonic distortion (THD) measurements, and spurious free dynamic range (SFDR) measurements. The ADC figure of merit measurements may also comprise at least one of integral nonlinearity (INL) measurements, and differential nonlinearity (DNL) measurements.

Another aspect of the invention relates to selection of the test input signals. The method may preferably further comprise the step of determining at least one test input signal so that the input signal causes a relatively large degradation in a predetermined figure of merit for the ADC.

In many embodiments, the ADC includes a digital-to-analog converter (DAC). For these embodiments, the method preferably further comprises the step of first calibrating error from the DAC.

An apparatus aspect of the present invention also is directed to calibrating an ADC. The apparatus preferably comprises drive means for driving the ADC with at least one test signal; calibrating means for calibrating the driven ADC over a plurality of ADC calibrations; measuring means for generating a plurality of ADC figure of merit measurements for respective ADC calibrations, the plurality of ADC figure of merit measurements defining at least a portion of a curve having a local minimum/maximum; and calibrating stop means for stopping calibrating at an ADC calibration corresponding to the local minimum/maximum of the curve defined by the plurality of ADC figure of merit measurements.

The calibrating stop means preferably comprises determining means for determining the local minimum/maximum of the curve. In addition, the determining means preferably comprises: equation fitting means for fitting an equation to the ADC figure of merit measurements; and calculating means for calculating the local minimum/maximum based upon the equation.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As would be readily understood by those skilled in the art, a pipelined or multi-step ADC subdivides the input range into segments for data conversion. The major segments are due to the first stage sub-converter and within each major segment the following (remaining) sub-converters divide the signal into finer, smaller segments, until the digital output is produced. The major error sources in the pipelined or multi-step architecture are the sub-converter digital-to-analog converter (DAC) errors and the inter-stage gain error as would also be appreciated by those skilled in the art. As a result of such errors, the end points of the adjacent code segments do not meet each other, and thereby introducing differential nonlinearity (DNL) and integrated nonlinearity (INL), for example. The DAC and interstage gain errors are limited by the intrinsic component matching of the process. Accordingly, to obtain a higher resolution ADC, the DAC and gain errors should desirably be trimmed or calibrated.

Figure 1:
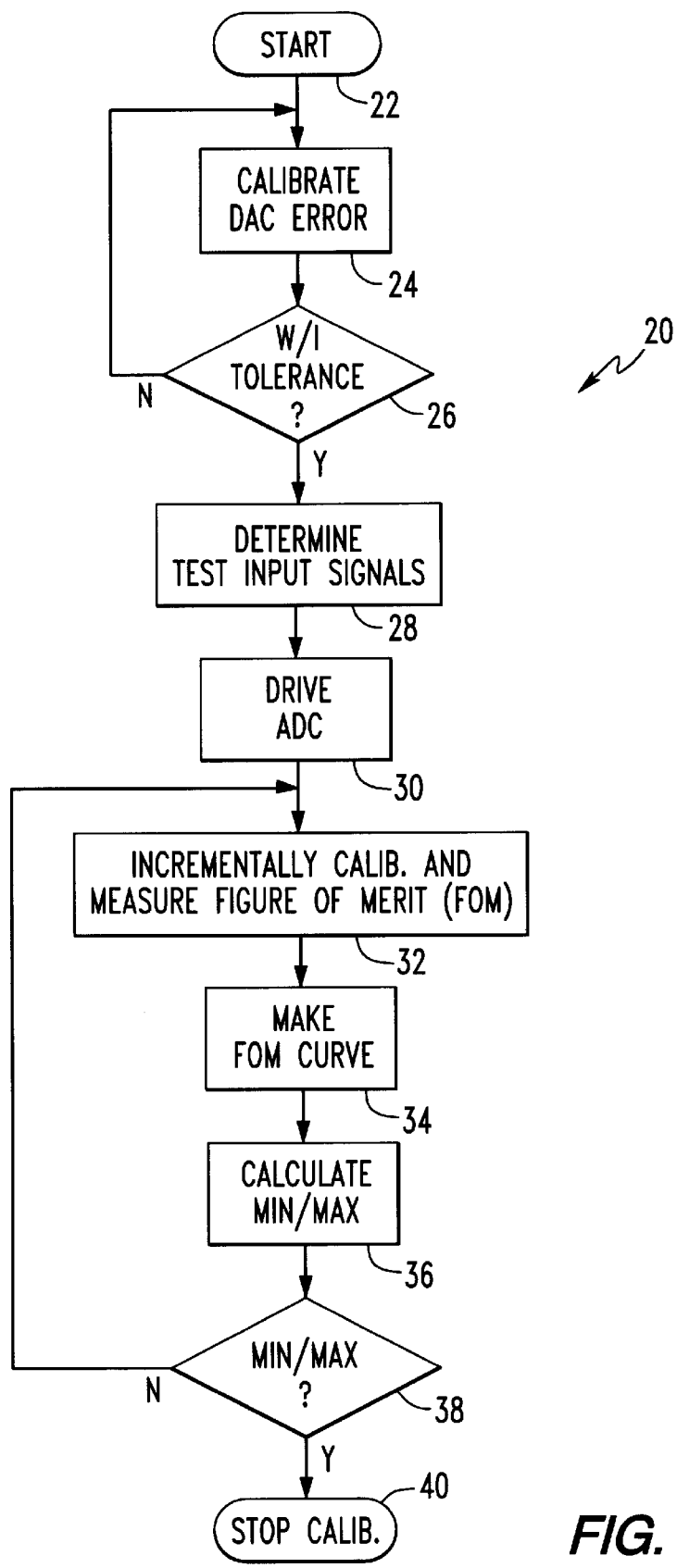
FIG. 1 is a flow chart of a method in accordance with the present invention.

Turning first to the flow chart 20 of FIG. 1, the method in accordance with the present invention is now described. From the start (Block 22), the DAC calibration can be achieved at Block 24 by conventional laser trimming, digital calibration, or other conventional approaches as would be readily understood by those skilled in the art. If the DAC error is within tolerance as determined at Block 26, the method proceeds, otherwise the DAC is again calibrated.

An ADC, either pipelined or multi-step with only inter-stage gain error exhibits a transfer function wherein the output code jumps between the code segments and introduces INL and DNL errors, which, in turn, introduce harmonic distortions and elevated quantization noise. Accordingly, in a typical plot of signal-to-noise and distortion (SINAD) versus input amplitude for such an ADC there can be a noticeable dip or degradation in performance at certain input levels. Errors occur when the input crosses over the discontinuities of the transfer curve as would be readily understood by those skilled in the art. For example, the error incurred for a larger amplitude signal may be relatively small compared to the input amplitude. On the other hand, the same error value incurred for a lower amplitude signal may be relatively large—thus degrading performance. Accordingly, the degradation in performance can be corrected by reducing the discontinuities in the transfer curve, through trimming or calibration as would be readily appreciated by those skilled in the art.

The present invention provides for determining of the test input signal(s) at Block 28. For example, a sampling and input frequency may be first selected. Next the input signal may be swept in amplitude from the full scale down to a certain lower level, for example. The performance measure or figure or merit, such as the SINAD versus input signal amplitude is recorded. The input level that corresponds to the most performance degradation is determined. The target (ideal) performance measure value is optionally determined from data points adjacent to the area of performance degradation.

Figure 2:
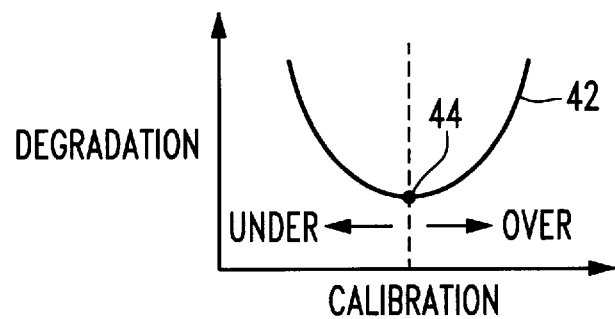
FIG. 2 is a graph of performance degradation versus calibration in accordance with the present invention.
Figure 3:
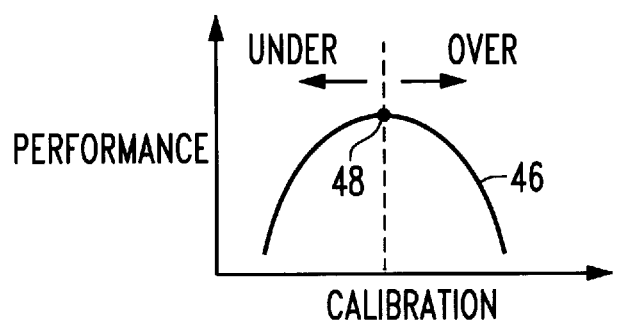
FIG. 3 is a graph of performance versus calibration in accordance with the present invention.

At Block 32 the ADC is calibrated and the performance monitored as the ADC is driven with the test input signal(s). The performance degradation versus trimming/calibration may be a non-linear function with a local minimum 44, as shown, for example, in the plot 42 of FIG. 2. The optimal calibration can be achieved by reaching the local minimum 44 of the degradation curve 42, or, conversely, by reaching a local maximum 48 of a performance curve 46 (FIG. 3) as would be readily understood by those skilled in the art.

The step of generating the series of respective ADC figure of merit measurements (Block 32) preferably comprises generating a series of figure of merit measurements which can tolerate a non-ideal input signal. For example, the ADC figure of merit measurements may be at least one of signal-to-noise ratio (SNR) measurements, signal-to-noise and distortion (SINAD) measurements, total harmonic distortion (THD) measurements, and spurious free dynamic range (SFDR) measurements. The series of successive ADC figure of merit measurements define at least a portion of a curve having a local minimum/maximum. The ADC figure of merit measurements may also comprise at least one of integral nonlinearity (INL) measurements, and differential nonlinearity (DNL) measurements which may exhibit a slightly less pronounced curvature or bow-shape as compared to the other figure of merit measurements as would be readily understood by those skilled in the art.

Considered in different terms, the present invention provides for dynamic performance measurement while performing the trimming/calibration in successive steps. Accordingly less output data samples are needed for the Fast Fourier Transform (FFT), as compared to a histogram method as disclosed, for example, in U.S. patent application Ser. No. 08/712,027, filed Sep. 11, 1996, entitled "INTEGRATED CIRCUIT ANALOG-TO-DIGITAL CONVERTER AND ASSOCIATED CALIBRATION METHOD AND APPARATUS" assigned to the present assignee, and the entire disclosure of which is incorporated herein by reference.

Returning again to the flow chart 20 of FIG. 1, a figure of merit curve may be made at Block 34 from the data points. For example, the previous 20 data points may be used. The curve may be a polynomial equation, such as of third order, for example, and as would be readily understood by those skilled in the art. From the curve, the location of the local min./max. may be determined at Block 36. As would be readily understood by those skilled in the art the local min./max. may be readily calculated by taking a first derivative of the equation. Where the first derivative equals zero indicates the local min./max. If the calibration is at the predicted or calculated min./max. as determined at Block 38, then the calibration stops (Block 40). If the proper calibration has not yet been reached, the ADC is incrementally calibrated to the next increment and the steps repeated as would be appreciated by those skilled in the art. The effect of intrinsic distortion in the input test signal on the figure of merit from the FFT will remain relatively constant as would be readily understood by those skilled in the art.

Figure 4:
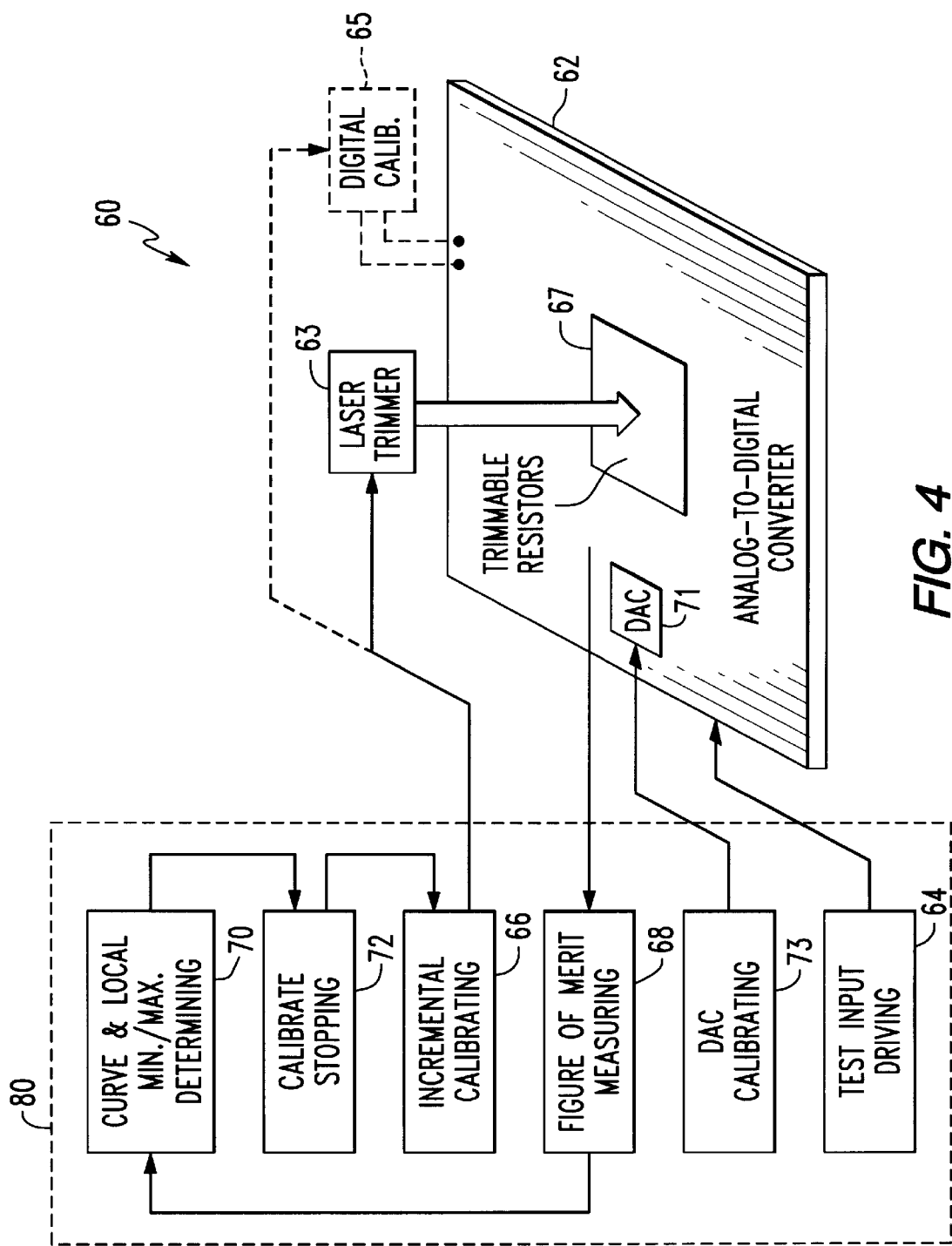
FIG. 4 is a schematic block diagram of the apparatus in accordance with the present invention.

Referring now additionally to FIG. 4, an apparatus 60 in accordance with the present invention is described for calibrating an ADC 62. The apparatus 60 preferably comprises a test input driver or driving means 64 driving the ADC with at least one test input signal. The test input driver 64 may further comprises means for determining the input signal(s) so that same causes a relatively large degradation in an ADC figure of merit as described in greater detail above.

The apparatus 60 also illustratively includes incremental calibrating means 66 for calibrating the driven ADC 62 over a plurality of successive calibrations. The incremental calibrations may be implemented by one or both of the illustrated laser trimmer 63 and digital calibrator 65 as would be readily understood by those skilled in the art. In addition, the calibrations may vary in direction and size for certain embodiments of the invention as would be readily appreciated by those skilled in the art.

The laser trimmer 63 is shown cooperating with trimmable resistors 67 on the ADC 62, although those of skill in the art will recognize that the laser may selectively disconnect resistors and/or capacitors, for example. Of course, those of skill in the art will recognize other calibration techniques as contemplated by the present invention.

The apparatus 60 further includes figure of merit measuring means 68 for generating a plurality of ADC figure of merit measurements for respective ADC calibrations. The figure of merit measuring means 68 preferably comprises means for generating ADC figure of merit measurements which can tolerate a non-ideal input signal. For example, the measuring means may generate the ADC figure of merit measurements from at least one of signal-to-noise ratio (SNR) measurements, signal-to-noise and distortion (SINAD) measurements, total harmonic distortion (THD) measurements, spurious free dynamic range (SFDR) measurements, integral nonlinearity (INL) measurements, and differential nonlinearity (DNL) measurements.

The plurality of ADC figure of merit measurements define at least a portion of a curve having a local min./max. as determined by the illustrated curve and local min./max. determining means 70. Considered in other terms, the illustrated curve and local min./max. determining means 70 provides equation fitting means which, in turn, preferably fits a polynomial equation, such as a third order equation, to the ADC figure of merit measurements. This portion may also include calculating means for calculating a first derivative of the equation to thereby determine the local min./max. as would be readily understood by those skilled in the art. The apparatus 60 also illustratively includes calibrating stop means 72 for stopping calibrating at an ADC calibration corresponding to the local min./max. of the curve defined by the plurality of ADC figure of merit measurements.

The ADC 62 may also include a digital-to-analog converter (DAC) 71. Accordingly, the apparatus 60 may further include DAC calibrating means 73 for calibrating error from the DAC as would be readily understood by those skilled in the art.

The various functions performed by the means described above may be carried out by the illustrated computer 80 operating under stored software control, for example, as would be readily understood by those skilled in the art. For example, a typical laser trimming machine may have a processor which can be readily programmed to carry out the functions described herein without further description.

Figure 5:
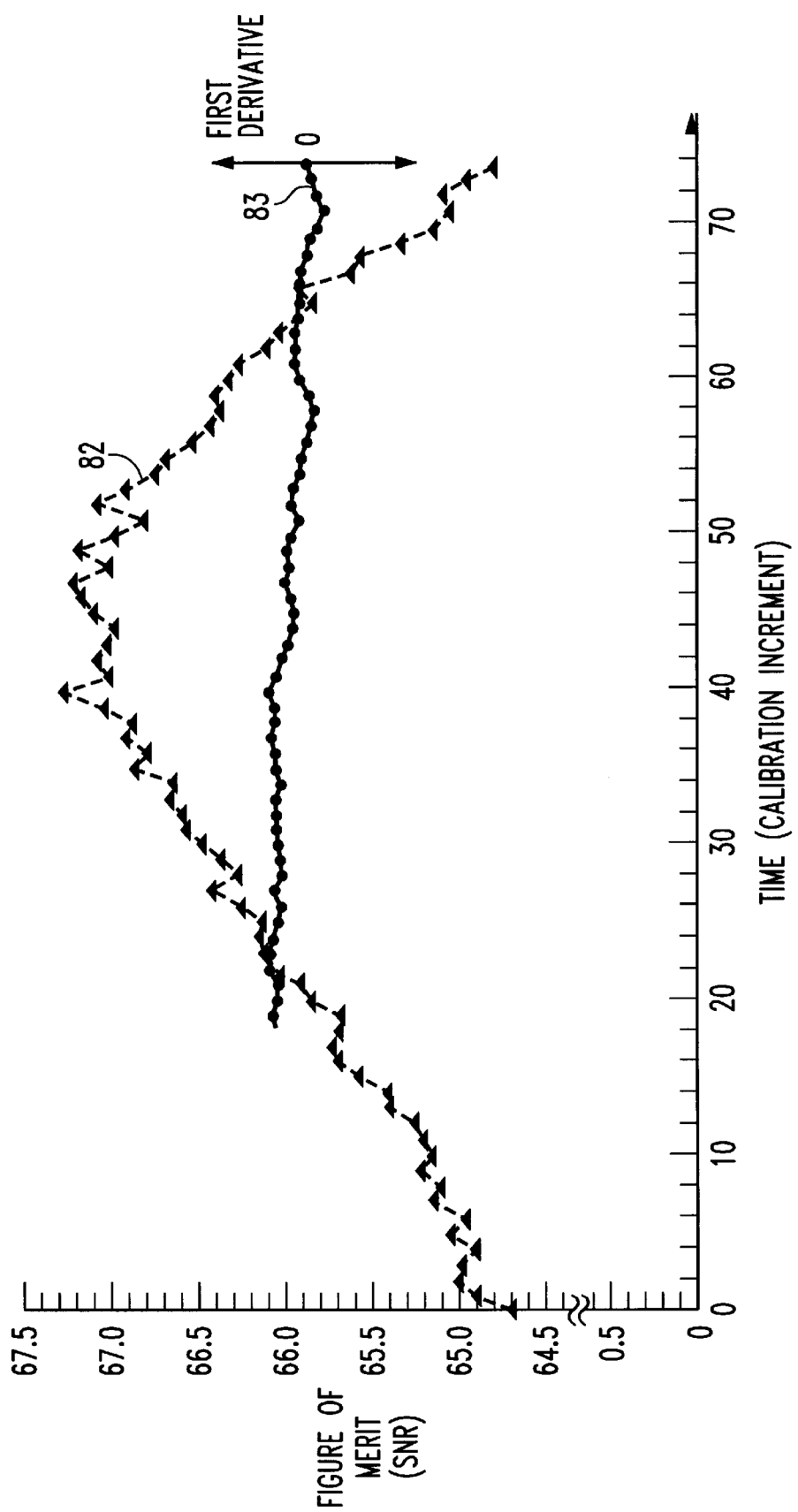
FIG. 5 is a graph of a figure of merit versus calibration in accordance with the present invention.

Turning now to FIG. 5 a series of figure of merit measurements of SNR are indicated by the solid triangles and as connected to define the curve labelled 82. The bow shape of the curve 82 is clearly evident. The plot labelled 83 is the first derivative of the curve 82. The first derivative 83 is about zero, or crosses zero, when the figure of merit is about 67 and at about a calibration time of about 42—this is the point of the local maximum. In other words, the plots indicate that the calibration could have been stopped at about 42 on the X-axis.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for calibrating an analog-to-digital converter (ADC), the method comprising the steps of:
   driving the ADC with at least one test signal;
   calibrating the driven ADC over a series of successive ADC calibrations;
   generating a series of successive ADC figure of merit measurements for respective successive ADC calibrations, the series of successive ADC figure of merit measurements defining at least a portion of a curve having a local minimum/maximum; and
   stopping calibrating at an ADC calibration corresponding to the local minimum/maximum of the curve defined by the series of successive ADC figure of merit measurements.

2. A method according to claim 1 further comprising the step of determining the local minimum/maximum of the curve.

3. A method according to claim 2 wherein the step of determining the local minimum/maximum comprises the steps of:
   fitting an equation to the series of ADC figure of merit measurements; and
   calculating the local minimum/maximum based upon the equation.

4. A method according to claim 3 wherein the step of fitting an equation comprises fitting same based upon a predetermined number of prior ADC figure of merit measurements.

5. A method according to claim 3 wherein the step of stopping the calibrating comprises stopping the calibrating based upon reaching the calculated local minimum/maximum to thereby avoid over calibrating the ADC.

6. A method according to claim 3 wherein the step of fitting the equation comprises the step of fitting a polynomial equation to the series of ADC figure of merit measurements.

7. A method according to claim 3 wherein the step of fitting the equation comprises the step of fitting a third order equation to the series of ADC figure of merit measurements.

8. A method according to claim 3 wherein the step of calculating the local minimum/maximum comprises the step of calculating a first derivative of the equation.

9. A method according to claim 1 wherein the step of generating the series of respective ADC figure of merit measurements comprises generating a series of figure of merit measurements which can tolerate a non-ideal at least one input signal.

10. A method according to claim 9 wherein the step of generating the series of respective ADC figure of merit measurements which can tolerate a non-ideal at least one input signal comprises generating a series of at least one of signal-to-noise ratio (SNR) measurements, signal-to-noise and distortion (SINAD) measurements, total harmonic distortion (THD) measurements, spurious free dynamic range (SFDR) measurements, integral nonlinearity (INL) measurements, and differential nonlinearity (DNL) measurements.

11. A method according to claim 1 further comprising the step of determining the at least one test input signal so that same causes a relatively large degradation in a predetermined figure of merit for the ADC.

12. A method according to claim 1 wherein the ADC includes a digital-to-analog converter (DAC), and further comprising the step of calibrating error from the DAC.

13. A method according to claim 1 wherein the step of calibrating comprises at least one of laser trimming and digital calibrating.

14. A method according to claim 1 wherein the step of calibrating comprises incrementally calibrating the ADC over the series of successive ADC calibrations.

15. A method for calibrating an analog-to-digital converter (ADC), the method comprising the steps of:
    driving the ADC with at least one test signal;
    calibrating the driven ADC over a plurality of ADC calibrations;
    generating a plurality of ADC figure of merit measurements for respective ADC calibrations, the plurality of ADC figure of merit measurements defining at least a portion of a curve having a local minimum/maximum; and
    stopping calibrating at an ADC calibration corresponding to the local minimum/maximum of the curve defined by the plurality of ADC figure of merit measurements.

16. A method according to claim 15 further comprising the step of determining the local minimum/maximum of the curve.

17. A method according to claim 16 wherein the step of determining the local minimum/maximum comprises the steps of:
    fitting an equation to the ADC figure of merit measurements; and
    calculating the local minimum/maximum based upon the equation.

18. A method according to claim 17 wherein the step of fitting an equation comprises fitting same based upon a predetermined number of prior ADC figure of merit measurements.

19. A method according to claim 17 wherein the step of stopping the calibrating comprises stopping the calibrating based upon reaching the calculated local minimum/maximum to thereby avoid over calibrating the ADC.

20. A method according to claim 17 wherein the step of fitting the equation comprises the step of fitting a polynomial equation to the ADC figure of merit measurements.

21. A method according to claim 17 wherein the step of fitting the equation comprises the step of fitting a third order equation to the ADC figure of merit measurements.

22. A method according to claim 17 wherein the step of calculating the local minimum/maximum comprises the step of calculating a first derivative of the equation.

23. A method according to claim 15 wherein the step of generating the respective ADC figure of merit measurements comprises generating figure of merit measurements which can tolerate a non-ideal at least one input signal.

24. A method according to claim 23 wherein the step of generating the respective ADC figure of merit measurements which can tolerate a non-ideal at least one input signal comprises generating at least one of signal-to-noise ratio (SNR) measurements, signal-to-noise and distortion (SINAD) measurements, total harmonic distortion (THD) measurements, spurious free dynamic range (SFDR) measurements, integral nonlinearity (INL) measurements, and differential nonlinearity (DNL) measurements.

25. A method according to claim 15 further comprising the step of determining the at least one test input signal so that same causes a relatively large degradation in a predetermined figure of merit for the ADC.

26. A method according to claim 15 wherein the ADC includes a digital-to-analog converter (DAC), and further comprising the step of calibrating error from the DAC.

27. A method according to claim 15 wherein the step of calibrating comprises at least one of laser trimming and digital calibrating.

28. A method according to claim 15 wherein the step of calibrating comprises incrementally calibrating the ADC.

29. An apparatus for calibrating an analog-to-digital converter (ADC) comprising:

drive means for driving the ADC with at least one test signal;

calibrating means for calibrating the ADC over a plurality of ADC calibrations;

measuring means for generating a plurality of ADC figure of merit measurements for respective ADC calibrations, the plurality of ADC figure of merit measurements defining at least a portion of a curve having a local minimum/maximum; and calibrating stop means for stopping calibrating at an ADC calibration corresponding to the local minimum/maximum of the curve defined by the plurality of ADC figure of merit measurements.

30. An apparatus according to claim 29 wherein said calibrating stop means comprises determining means for determining the local minimum/maximum of the curve.

31. An apparatus according to claim 30 wherein the determining means comprises:

equation fitting means for fitting an equation to the ADC figure of merit measurements; and calculating means for calculating the local minimum/maximum based upon the equation.

32. An apparatus according to claim 30 wherein the equation fitting means comprises means for fitting the equation based upon a predetermined number of prior ADC figure of merit measurements.

33. An apparatus according to claim 31 wherein the calibrating stop means comprises means for stopping the calibrating based upon reaching the calculated local minimum/maximum to thereby avoid over calibrating the ADC.

34. An apparatus according to claim 31 wherein the equation fitting means comprises means for fitting a polynomial equation to the ADC figure of merit measurements.

35. An apparatus according to claim 31 wherein the equation fitting means comprises means for fitting a third order equation to the ADC figure of merit measurements.

36. An apparatus according to claim 31 wherein the calculating means comprises means for calculating a first derivative of the equation.

37. An apparatus according to claim 29 wherein the measuring means comprises means for generating ADC figure of merit measurements which can tolerate a non-ideal at least one input signal.

38. An apparatus according to claim 37 wherein the measuring means comprises means for generating ADC figure of merit measurements from at least one of signal-to-noise ratio (SNR) measurements, signal-to-noise and distortion (SINAD) measurements, total harmonic distortion (THD) measurements, spurious free dynamic range measurements, integral nonlinearity (INL) measurements, and differential nonlinearity (DNL) measurements.

39. An apparatus according to claim 29 wherein said drive means further comprises means for determining the at least one test input signal so that same causes a relatively large degradation in a predetermined figure of merit for the ADC.

40. An apparatus according to claim 29 wherein the ADC includes a digital-to-analog converter (DAC), and further comprising DAC calibrating means for calibrating error from the DAC.

41. An apparatus according to claim 29 wherein the calibrating means comprises means for at least one of laser trimming and digital calibrating.

42. An apparatus according to claim 29 wherein the calibrating means comprises means for incrementally calibrating the ADC.

* * * * *